(12) United States Patent
Danver

(10) Patent No.: US 6,890,636 B2
(45) Date of Patent: May 10, 2005

(54) THERMALLY STABLE, NON-WOVEN, FIBROUS PAPER, DERIVATIVES THEREOF, AND METHODS FOR MANUFACTURING THE SAME

(75) Inventor: Dale Danver, Holland, MI (US)

(73) Assignee: Sordal Incorporated, Holland, MI (US)

(\*) Notice: Subject to any disclaimer, the term of this patent is extended or adjusted under 35 U.S.C. 154(b) by 39 days.

(21) Appl. No.: 10/051,953

(22) Filed: Jan. 17, 2002

(65) Prior Publication Data

US 2002/0127422 A1 Sep. 12, 2002

Related U.S. Application Data

(63) Continuation-in-part of application No. 09/547,147, filed on Apr. 11, 2000, now abandoned.

(51) Int. Cl.$^7$ .................... B32B 15/14; B32B 27/04; D04H 1/00; D21F 11/00; B01D 24/00
(52) U.S. Cl. .................. 428/297.4; 442/327; 442/376; 442/401; 210/505; 210/508; 162/157.2; 162/157.3; 162/146
(58) Field of Search .................. 428/297.4; 441/327, 441/376, 401; 210/505, 508; 162/157.2, 157.3, 146

(56) References Cited

U.S. PATENT DOCUMENTS 2,999,788 A 9/1961 Morgan

FOREIGN PATENT DOCUMENTS

| JP | 09021089 A | * | 1/1997 | .......... D21H/13/24 |
| JP | 2001-140189 | * | 5/2001 | .......... D21H/13/12 |
| WO | WO 94/0622 | * | 3/1994 | .......... C09D/179/04 |

\* cited by examiner

*Primary Examiner*—Rena Dye
*Assistant Examiner*—Lawrence Ferguson
(74) *Attorney, Agent, or Firm*—King & Jovanovic, PLC

(57) ABSTRACT

A thermally stable, non-woven, fibrous paper comprising at least one polymer represented by structural formula I:

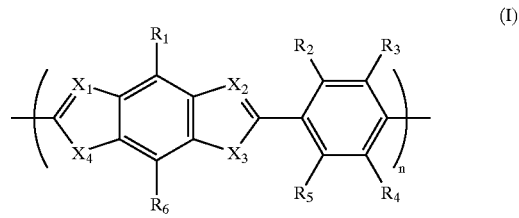

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; wherein $X_{1-4}$ are the same or different and comprise N, O, S, or Se; and wherein n is an integer ranging in value from 1 to approximately 10,000.

12 Claims, No Drawings

THERMALLY STABLE, NON-WOVEN, FIBROUS PAPER, DERIVATIVES THEREOF, AND METHODS FOR MANUFACTURING THE SAME

CROSS-REFERENCE TO RELATED APPLICATION(S)

This application is a continuation-in-part of co-pending U.S. application Ser. No. 09/547,147, filed Apr. 11, 2000, now abandoned, which is hereby incorporated herein by reference in its entirety.

BACKGROUND OF THE INVENTION

1. Field of the Invention

The present invention relates in general to non-woven paper compositions, and more particularly, to thermally stable, non-woven, paper compositions, which are fabricated at least in part from poly(para-phenylene-2,6-benzobisoxazole) and thermally stable derivatives thereof.

2. Background Art

To the best of Applicant's knowledge, stone was utilized as the first medium to record human activity and/or history. Years later, bark, leaves, and ivory were utilized as advanced mediums to record human activity because of, among other things, their beneficial weight properties—compared to stone. Historians have further indicated that sometime between approximately 2500 B.C. and 2000 B.C., the manufacture of writing paper (in a crude form as we know it today) initiated from utilization of a tall reed growing along the Nile River in Egypt called papyrus; hence the name paper. Historians have also indicated that other early writing materials were dried calf and goatskin parchment, wax-covered boards believed to be used by the Romans, and clay-brick records believed to be preserved from Babylonian times.

To the best of Applicant's knowledge, the actual manufacture of paper was invented by the Chinese sometime around 100 A.D., but it was not until the end of the fourteenth century that the manufacturing process had undergone material improvements in southern Europe. The paper industry did not obtain a firm foothold in England until the seventeenth century.

Around 1750, the Hollander Beater was developed for the purpose of making paper. In 1799, a Frenchman, Louis Robert, invented a process for forming a sheet of paper on a moving wire screen. This machine is known today as the Fourdriner machine. The Fourdriner process came to the Americas in 1844. Using the Fourdriner machine, an American Chemist Tilghman was granted a United States Patent (U.S. Pat. No. 70,485) for the sulfide process. Later the sulfate, or Kraft process, was developed by Dahl around 1884 in Danzig, Germany. In 1904 the Kraft paper making process was adopted in America and remains, to this day, a dominant method for manufacturing cellulose based papers.

As the demand for the volume of paper grew in the industrial age, so did the demand for enhanced physical properties of paper. In the 1960's, E. I. Du Pont de Nemours and Company answered some of the commercial demands for enhanced physical properties by incorporating non-rigid synthetic fibers into paper (see U.S. Pat. No. 2,999,788).

Notwithstanding the distinct and continuous historical advancements in recording human activity and/or history, which very recently (historically speaking) has utilized paper, there remains a strong commercial demand for continued enhancements in the physical properties of paper. For example, one substantial drawback associated with even the newer synthetic papers is their lack of comprehensive thermal stability and strength—among many other characteristics. Indeed, the demand for a thermally stable paper and associated products that can acceptably withstand substantial exposure to elevated temperatures remains strong, and, to the best of Applicant's knowledge, unsatisfied. Moreover, conventional synthetic papers also lack comprehensive strength and therefore require, in many applications, additional undesirable amounts of paper—which can materially increase weight.

It is therefore an object of the present invention to provide thermally stable, non-woven, paper compositions, which are fabricated at least in part from poly(para-phenylene-2,6-benzobisoxazole) and thermally stable derivatives thereof which satisfy at least some of the present commercial demand for paper and associated products having enhanced physical properties.

SUMMARY OF THE INVENTION

The present invention is directed to a thermally stable, non-woven, fibrous paper comprising at least one polymer represented by structural formula I:

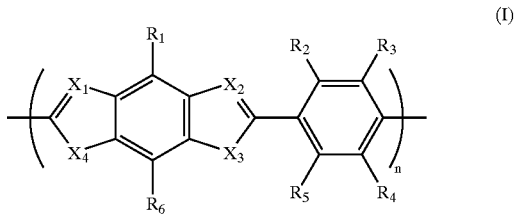

(I)

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; wherein $X_{1-4}$ are the same or different and comprise N, O, S, or Se; and wherein n is an integer ranging in value from 1 to approximately 10,000.

In a preferred embodiment of the present invention, $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; $X_{1-2}$ comprise N; $X_{3-4}$ comprise O; and n is an integer ranging in value from 1 to approximately 10,000.

In another preferred embodiment of the present invention, $R_{1-6}$ comprise H; $X_{1-2}$ comprise N; $X_{3-4}$ comprise O; and n is an integer ranging in value from 1 to approximately 10,000.

In yet another preferred embodiment of the present invention, $R_{1-6}$ comprise H; $X_{1-2}$ comprise N; $X_{3-4}$ comprise O; and n is an integer ranging in value from 1 to approximately 5,000.

In accordance with the present invention, the paper is thermally stable to at least 200 degrees centigrade, preferably thermally stable to at least 500 degrees centigrade, and more preferably thermally stable to at least 650 degrees centigrade.

In a preferred embodiment of the present invention, the paper further comprises a binder, a pH modifier, a transition metal dopant, water, and/or other additives. In this embodiment the concentration of the water is preferably less than 5 weight percent.

According to the present invention, the concentration of the at least one polymer represented by structural formula I ranges from approximately 50 to approximately 100 weight percent.

The present invention is also directed to a honeycomb core fabricated from a thermally stable, non-woven, fibrous paper comprising at least one polymer represented by structural formula I provided hereinabove.

The present invention is further directed to a thermally stable, non-woven, fibrous paper comprising: (a) at least one binder; (b) water; and (c) at least one polymer represented by structural formula I:

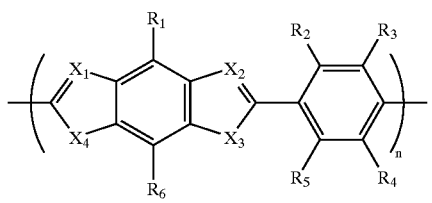

(I)

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; wherein $X_{1-4}$ are the same or different and comprise N, O, S, or Se; and wherein n is an integer ranging in value from 1 to approximately 10,000.

DETAILED DESCRIPTION OF THE INVENTION

While this invention is susceptible of embodiment in many different forms, there is shown in the drawings and described herein in detail several specific embodiments with the understanding that the present disclosure is to be considered as an exemplification of the principles of the invention and is not intended to limit the invention to the embodiments illustrated.

The present invention concerns thermally stable, non-woven, fibrous paper fabricated at least in part from poly(para-phenylene-2,6-benzobisoxazole) and derivatives thereof which are represented by structural formula I:

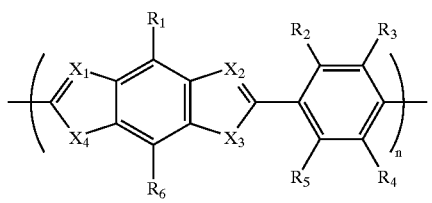

(I)

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; wherein $X_{1-4}$ are the same or different and comprise N, O, S, or Se; and wherein n is an integer ranging in value from 1 to approximately 10,000, and more preferably from 1 to approximately 5,000. Poly(para-phenylene-2,6-benzobisoxazole) (hereinafter "PBO") is commercially available in as spun or high modulus forms from Toyobo Co., of Osaka, Japan. It will be understood that derivatives of the monomer unit can be obtained from Aldrich Chemical Co., of Milwaukee, Wis., and other commercially known chemical vendors. PBO fiber is especially preferred because it is thermally stable to at least 650 degrees centigrade, which enables associated paper to be used in a plurality of applications which are temperature variant and/or temperature critical.

It will be understood that regardless of its ordinary meaning, the term "paper" will be defined herein as a thin material consisting of substantially flat sheets, made from fibers, for a plurality of purposes. Additionally, it will be understood that the term "thermally stable" will be defined herein, regardless of its ordinary meaning, as being capable of undergoing proximate exposure to a substantial heat source, such as a flame or other heat source, without melting, flaming, or materially degrading.

It will be further understood that the thermally stable, non-woven, fibrous paper of the present invention may comprise polymers, copolymers which may be random or alternating and/or block or grafted in nature, or a hybrid of both. It will be further understood that numerous other polymer configurations that would be known to those with ordinary skill in the art having the present disclosure before them are likewise contemplated for use.

As will be discussed in greater detail below, the thermally stable, non-woven, fibrous paper of the present invention may comprise solely PBO and/or derivatives thereof, or, alternatively, comprise a composition of PBO and/or derivatives thereof as well as a binder, pH modifier, water (preferably less than 5 weight percent), metal dopant, and/or other additives.

Binders of the present invention may include swelled PBO and derivatives thereof as well as any one of a number of conventional binders that would be known to those having ordinary skill in the art having the present disclosure before them are likewise contemplated for use.

pH modifiers of the present invention may comprise alkaline or acidic materials as well as buffers thereof.

Metal dopants of the present invention may include Group 1A metals, Group 2A metals, transition or d-block metals and may serve to alter the paper's conductivity and/or electrochemical properties as well as physical properties, including structural integrity.

Additional additives for use in association with the present invention include, for example, polyimide friable balloons; polyimide powders; polyimide microspheres; synthetic fibers such as nylon; para or beta aramids; natural fibers such as cellulose pulp to approximately 15%; poly(ethylene terephthalate); polyacylonitrile; dyes, inks, color bodies; antistatic agents; surfactants; fillers such as silica, titanium dioxide, pigments, antioxidants, etcetera; modified starches such as potato, corn, etcetera; animal glues; thermoset organic resins; plasticizers such as latex, natural and synthetic rubber, etcetera; and common virgin or recycled plastics such as PET, polycarbonate (PC), high density polyethylene (HDPE), polyvinylchloride (PVC), chlorinated polyvinylchloride (CPVC)—just to name a few. The above-identified additives may be included to improve or modify paper finish, surface, opacity, physical strength, chemical resistance, and/or texture.

The thermally stable, non-woven, fibrous papers of the present invention can be fabricated using one of two techniques, which include the wet process, and the dry process.

Wet Processing

First, PBO chopped fiber, approximately 6 mm in length, is introduced into a conventional digester which has a solution of 10% poly-phosphoric acid at 60 degrees centigrade which is held for at least 48 hours. Alternatively, sulfuric acid can be used. This allows the PBO fiber to steep and swell (digest), thereby enabling the generation of pulp therefrom. After steeping is completed, the pulp is transferred via a pneumatic or centrifugal pump to a conventional stock tank. Within the stock tank a substantially equal measure of 6-mm PBO undigested fiber is added, thereby generating a composite solution. The composite solution is then pumped through a number of conventional washers, filters, and screens to co-mingle the PBO pulp and the PBO fiber. Next, the composite solution is introduced into a beater and Jordon mixer to ensure a homogeneity of the same. After mixing, the resulting solution is pumped into a Fourdriner process headbox, wherein the PBO formulation overflows onto the Fourdriner continuous wire mesh bed with vacuum below to remove the aqueous solution (dilute acid waters). The PBO composite remains on a conventional traveling wire mesh and is further processed to remove the aqueous solution mechanically by pressing the PBO, now in a paper sheet form, to about 50% dry solids. The roll pressures are about 1,500 pounds per linear inch of web. The PBO sheet is then introduced to conventional drying rollers which keep the PBO paper under pressure but at elevating temperatures, typically from approximately 200 degrees Fahrenheit to approximately 350 degrees Fahrenheit. The finished PBO paper from the Fourdriner machine is then inline densified and surface smoothed using a conventional calendar machine at elevated temperatures. At this point, the PBO paper will substantially exhibit a thickness ranging from approximately 0.005 inches to approximately 0.025 inches. Optionally, the PBO may be further processed in a super calendar machine which applies extreme roll pressures (over approximately 5,000 pounds per linear inch of PBO paper web, at a temperature ranging from approximately 600 degrees Fahrenheit to approximately 1,000 degrees Fahrenheit). Such extreme calendaring preferably occurs in the absence of oxygen, and, therefore, an inert atmosphere of, for example, nitrogen or argon is preferred. At this point, the PBO paper exhibits a thickness of approximately 0.0005 inches. It has been experimentally determined that non-woven, fibrous paper fabricated in accordance with the above-identified process exhibited remarkable thermal stability—even at temperatures reaching 650 degrees Centigrade. Furthermore, the paper exhibited: (1) a tensile strength of 840 KSI; (2) a tensile modulus of 39 MSI; and (3) a moisture regain of 0.6% Similar characteristics are obtainable using dry processing provided hereinbelow.

Dry Processing

PBO chopped fiber, approximately 6 mm in length, is introduced into a conventional high-speed shredder or hammermill to fibrillate the fiber into a "cotton-candy" like consistency. To ensure adequate fiber separation, it is then pneumatically conveyed and recycled at a nominal velocity of approximately 2,000 feet per minute. Once uniform and homogeneous in consistency, the fiber is pneumatically transferred to a continuous floc machine wherein the fiber is randomly discharged onto the traveling wire mesh bed. During this deposition a small amount of polyimide friable microspheres are carefully metered and act as a binding agent in the PBO paper. The amount of polyimide additive may vary from approximately 1% to approximately 5% by weight. The composition of the polyimide microspheres is:

|  | Wet-Basis | As-Metered |
|---|---|---|
| Methyl Alcohol (MeOH-solvent) | 13% | 5% |
| Tetrahydrofuran (THF-solvent) | 52% | 20% |
| 3,4 Oxydianiline (amine component) | 13% | 27% |
| 4,4' Oxydiphthalic Anhydride (monomer component) | 10% | 22% |
| 4,4' Oxydiphalic Acid (monomer co-factor) | 12% | 26% |
|  | 100% | 100% |

After the addition of the polyimide microspheres, the floc is pressed inline at a temperature of at least 250 degrees Fahrenheit so that the composite material is less than approximately 0.125 inches thick and typically about 0.03125 inches. Preferably, the PBO paper sheet then enters into a horizontal oven to condition the PBO paper. Immediately prior to the entry into the 350 degree Fahrenheit oven, other additives or binders, as disclosed herein, may be utilized to promote different desired characteristics of the PBO paper. By way of example, if the PBO paper is to be utilized to make honeycomb cores a small amount of the organic resin, less than approximately 0.5% may be added. The organic resin aids in the adhesion properties in the honeycomb core manufacturing process. The PBO paper leaves the horizontal oven dry and coiled. Finally, the PBO paper may be super-calendared (as described in the wet process) to further increase uniformity and consistency.

Thermally stable, non-woven, fibrous papers, and derivatives thereof, can be used in a wide variety of applications wherein thermal stability and enhanced physical properties are desirable and/or critical. Such applications include, for example, civilian, military, and space aircraft and honeycomb cores associated therewith; space vehicles; electronic and electrical devices, including circuit boards; telecommunications; insulators; paper currency; historical preservation notes and archives; automotive applications; and protective clothing—just to name a few.

It will be understood that one primary benefit associated with the novel fibrous papers disclosed herein is that energy consumption can be materially reduced. By way of example, because of the comprehensive strength and thermal stability of the disclosed papers, aircraft having components fabricated from the present papers can be substantially lighter because the remarkable strength of the paper enables substantially less material to be used during fabrication. Such a reduction in material enables an aircraft to carry less fuel inasmuch as it is well accepted that for every one pound of weight removed from an aircraft results in three pounds of fuel savings. The fuel savings, in turn, directly benefits air quality because the destruction of ozone is reduced via decreased combustion. To be sure, when analyzed in the aggregate relative to the number of planes in the air every day, the energy conservation and, in turn, preservation of air quality is, indeed, substantial.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. A thermally stable, non-woven, fibrous paper, comprising:

at least one polymer represented by structural formula I:

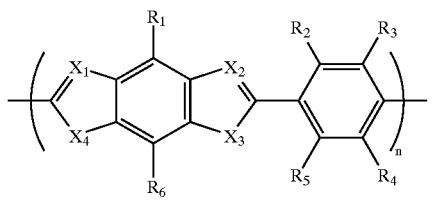

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof;

wherein $X_{1-4}$ are the same or different and comprise N, O, S or Se;

wherein n is an integer ranging in value from 1 to approximately 10,000;

wherein the thermally stable, non-woven, fibrous paper is thermally stable to at least 650 degrees centigrade; and wherein the thermally stable, non-woven, fibrous paper further comprises at least one additive selected from the group consisting of polyimide friable balloons, polyimide powders, and polyimide microspheres.

2. The thermally stable, non-woven, fibrous paper according to claim 1, wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof; wherein $X_{1-2}$ comprise N; wherein $X_{3-4}$ comprise O; and wherein n is an integer ranging in value from 1 to approximately 10,000.

3. The thermally stable, non-woven, fibrous paper according to claim 2, wherein $R_{1-6}$ comprise H; wherein $X_{1-2}$ comprise N; wherein $X_{3-4}$ comprise O; and wherein n is an integer ranging in value from 1 to approximately 10,000.

4. The thermally stable, non-woven, fibrous paper according to claim 3, wherein $R_{1-6}$ comprise H; wherein $X_{1-2}$ comprise N; wherein $X_{3-4}$ comprise O; and wherein n is an integer ranging in value from 1 to approximately 5,000.

5. The thermally stable, non-woven, fibrous paper according to claim 1, wherein the paper further comprises a binder.

6. The thermally stable, non-woven, fibrous paper according to claim 1, wherein the paper further comprises water.

7. The thermally stable, non-woven, fibrous paper according to claim 6, wherein the concentration of the water is less than 5 weight percent.

8. The thermally stable, non-woven, fibrous paper according to claim 1, wherein the concentration of the at least one polymer represented by structural formula I ranges from approximately 50 to approximately 100 weight percent.

9. The thermally stable, non-woven, fibrous paper according to claim 1, wherein the paper further comprises a pH modifier.

10. The thermally stable, non-woven, fibrous paper according to claim 1, wherein the paper is incorporated into a honeycomb core.

11. The thermally stable, non-woven, fibrous paper according to claim 1, wherein the paper is doped with a transition metal.

12. A thermally stable, non-woven, fibrous paper, comprising:

at least one binder;

water; and at least one polymer represented by structural formula I:

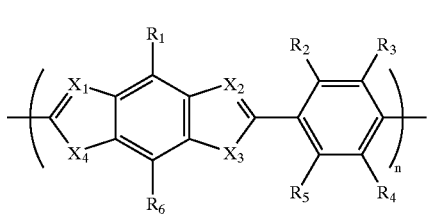

wherein $R_{1-6}$ are the same or different and comprise H, a hydroxyl group, a straight or branched alkyl, cycloalkyl, polycycloalkyl, heterocycloalkyl, alkaryl, alkoxy, aryl, aralkyl, alkenyl, or alkynyl group containing approximately 1 to approximately 50 carbon atom(s), carbonyls, esters, carbonates, amides, ketenes, epoxides, a silyl or siloxyl group containing approximately 1 to approximately 50 silicon atom(s), and combinations thereof;

wherein $X_{1-4}$ are the same or different and comprise N, O, S, or Se;

wherein n is an integer ranging in value from 1 to approximately 10,000; and wherein the thermally stable, non-woven, fibrous paper further comprises at least one additive selected from the group consisting of polyimide friable balloons, polyimide powders, and polyimide microspheres.

* * * * *